US009112143B2

(12) United States Patent
Lu

(10) Patent No.: US 9,112,143 B2
(45) Date of Patent: Aug. 18, 2015

(54) METHOD FOR PROCESSING MESSAGES AND NETWORK DEVICE

(75) Inventor: Zhihao Lu, Shenzhen (CN)

(73) Assignee: ZTE CORPORATION, Shenzhen, Guangdong Province (CN)

( * ) Notice: Subject to any disclaimer, the term of this patent is extended or adjusted under 35 U.S.C. 154(b) by 570 days.

(21) Appl. No.: 13/379,013

(22) PCT Filed: Jun. 7, 2010

(86) PCT No.: PCT/CN2010/073629
§ 371 (c)(1),
(2), (4) Date: Dec. 17, 2011

(87) PCT Pub. No.: WO2010/145472
PCT Pub. Date: Dec. 23, 2010

(65) Prior Publication Data
US 2012/0096090 A1 Apr. 19, 2012

(30) Foreign Application Priority Data

Jun. 19, 2009 (CN) .......................... 2009 1 0108353

(51) Int. Cl.
H01L 41/12 (2006.01)
(52) U.S. Cl.
CPC ..................................... H01L 41/12 (2013.01)
(58) Field of Classification Search
None
See application file for complete search history.

(56) References Cited

U.S. PATENT DOCUMENTS 8,312,541 B2 * 11/2012 Levy-Abegnoli et al. ...... 726/23
8,369,293 B2 * 2/2013 Kumazawa et al. .......... 370/338
2004/0111494 A1 * 6/2004 Kostic et al. ................... 709/220
2007/0133539 A1 * 6/2007 Kang et al. ..................... 370/392
2007/0274232 A1 * 11/2007 Axelsson et al. ............. 370/254
2007/0280135 A1 * 12/2007 Syed et al. ..................... 370/254
2008/0310323 A1 * 12/2008 Shirota et al. ................ 370/254
2009/0219832 A1 * 9/2009 Velev et al. ................... 370/254

(Continued)

FOREIGN PATENT DOCUMENTS

CN        1578270 A      2/2005
CN      101330447 A     12/2008

(Continued)

OTHER PUBLICATIONS

International Search Report for PCT/CN2010/073629 dated Aug. 23, 2010.

Primary Examiner — Greg C Bengzon
(74) Attorney, Agent, or Firm — Ling Wu; Stephen Yang; Ling and Yang Intellectual Property

(57) ABSTRACT

A method for processing messages comprises: a first device sending a neighbor solicitation message to a second device, and then creating information of the second device based on a neighbor advertisement message replied by the second device; the first device sending a detection request message to the second device based on the created information of the second device, and determining whether a detection reply message sent by the second device is received in a period of time, and if it is not received, then the first device deleting the created information of the second device. Accordingly, a network device is provided comprising a neighbor solicitation message sending module, a neighbor advertisement message receiving module, an information creating module, a detection request message sending module and a detection reply message receiving module.

5 Claims, 2 Drawing Sheets

(56) References Cited

U.S. PATENT DOCUMENTS

2010/0177774 A1* 7/2010 Hart et al. .................. 370/392
2012/0224576 A1* 9/2012 Gu et al. .................... 370/390

FOREIGN PATENT DOCUMENTS

CN           101610186 A     12/2009
JP           2006246369 A    9/2006

* cited by examiner

United States Patent US 9,112,143 B2

METHOD FOR PROCESSING MESSAGES AND NETWORK DEVICE

TECHNICAL FIELD

The present invention relates to the IPv6 protocol, and in particular, to a method for processing messages in the ND protocol and a network device.

BACKGROUND OF THE RELATED ART

Although the Internet Protocol version 6 (IPv6), which is the IP protocol in the next generation internet, has obvious advantages, it also has many security loopholes. The Neighbor Discovery (ND) protocol is a very important protocol in the IPv6 protocol, and its main functions are to discover link layer addresses of other devices, and keep the link layer addresses active or update the link layer addresses via ND protocol messages.

The ND protocol messages include the Neighbor Solicitation (NS) messages and Neighbor Advertisement (NA) messages.

SUMMARY OF THE INVENTION

NA messages with false link layer addresses exist in the prior art networks. A device will update its stored correct link layer addresses of other devices after receiving such NA messages with the false link layer addresses, causing link disconnection.

A technical problem to be solved by the present invention is to provide a method for processing messages and a network device so as to overcome the problem in the IPv6 protocol of link disconnection caused when a device updates its stored correct link layer addresses of other devices after receiving NA messages with false link layer addresses.

In order to solve the problem described above, the present invention provides a method for processing messages comprising:

a first device sending a neighbor solicitation message to a second device, and creating information of the second device based on a neighbor advertisement message replied by the second device;

the first device sending a detection request message to the second device based on the created information of the second device; and the first device determining whether a detection reply message sent by the second device is received in a period of time, and if the detection reply message is not received, then the first device deleting the created information of the second device.

The method further comprises: if the first device receives the detection reply message sent by the second device in the period of time, then the first device determining that the created information of the second device is legal, and reserving the created legal information of the second device.

After the step of the first device reserving the created legal information of the second device, the method further comprises:

the first device receiving the neighbor advertisement message sent by the second device; and the first device updating the created legal information of the second device based on the neighbor advertisement message.

The information of the second device contains a link layer address of the second device.

After the step of the first device reserving the created legal information of the second device, the method further comprises:

the first device receiving the neighbor advertisement message sent by the second device; and the first device determining whether a link layer address in the neighbor advertisement message is consistent with the link layer address in the created information of the second device;

if yes, updating the created information of the second device based on the neighbor advertisement message; and if not, discarding the neighbor advertisement message.

The step of the first device sending the detection request message to the second device comprises: the first device invoking a network control message protocol, and sending the detection request message in the network control message protocol to the second device.

The present invention further provides a network device comprising:

a neighbor solicitation message sending module configured to send a neighbor solicitation message to a second device;

a neighbor advertisement message receiving module configured to receive a neighbor advertisement message replied by the second device to send to an information creating module;

the information creating module configured to create and store information of the second device based on the neighbor advertisement message, and send the information of the second device to a detection request message sending module; and delete the information of the second device after receiving a deletion indication of a detection reply message receiving module;

the detection request message sending module configured to send a detection request message to the second device based on the created information of the second device, and indicate the detection reply message receiving module; and the detection reply message receiving module configured to determine whether a detection reply message sent by the second device is received in a period of time after receiving an indication of the detection request message sending module, and if the detection reply message is not received, send the deletion indication to the information creating module.

The detection reply message receiving module is further configured to determine that the created information of the second device is legal if the detection reply message sent by the second device is received in the period of time, and notify the information creating module that the information of the second device is legal.

The information creating module is further configured to, after receiving a notification that the information of the second device is legal sent by the detection reply message receiving module, update the created legal information of the second device based on the neighbor advertisement message if the neighbor advertisement message sent by the second device is received.

The information of the second device contains a link layer address of the second device.

The information creating module is further configured to, after receiving the notification that the information of the second device is legal sent by the detection reply message receiving module, determine whether a link layer address in the neighbor advertisement message is consistent with the link layer address in the created information of the second device if the neighbor advertisement message sent by the second device is received, and if yes, update the information of the second device based on the neighbor advertisement message; if not, discard the neighbor advertisement message.

In addition, the present invention further provides a method for processing messages comprising:

a first device sending a neighbor solicitation message to a second device;

the first device receiving a neighbor advertisement message sent by the second device;

the first device determining whether information of the second device corresponding to the neighbor advertisement message exists; and if it does not exist, creating the information of the second device based on the neighbor advertisement message replied by the second device;

if it exists, the first device determining whether a link layer address in the neighbor advertisement message is consistent with a link layer address in created information of the second device; if yes, updating the created information of the second device based on the neighbor advertisement message; if not, discarding the neighbor advertisement message.

The present invention further provides a network device comprising:

a neighbor solicitation message sending module configured to send a neighbor solicitation message to a second device;

a neighbor advertisement message receiving module configured to receive a neighbor advertisement message replied by the second device to send to an information creating module; and the information creating module configured to determine whether information of the second device corresponding to the neighbor advertisement message exists; if it does not exist, create and store the information of the second device based on the received neighbor advertisement message; if it exists, determine whether a link layer address in the neighbor advertisement message is consistent with a link layer address in the created information of the second device; if yes, update the created information of the second device based on the neighbor advertisement message; if not, discard the neighbor advertisement message.

Comparing with the prior art, a method for processing messages provided by the present invention can effectively decrease effects of a NA messages with a false link layer address on a link layer address stored by the first device in following two cases. In the first case, when the information of the second device is created in the first device, the first device creates the information of the second device based on the received NA message sent by the second device, and determines whether the created information of the second device is legal by invoking the network control message protocol. In the second case, the first device receives a NA message sent by the second device after having created legal information of the second device, and verifies whether a link layer address in the NA message is consistent with the legal link layer address. The effects of the NA message with the false link layer address are effectively decreased by the processing of the NA messages in both cases.

PREFERRED EMBODIMENTS OF THE PRESENT INVENTION

The technical scheme of the present invention will be described in detail in conjunction with specific embodiments and accompanying drawings.

Effects of a NA message with a false link layer address are decreased mainly in two cases.

Figure 1:
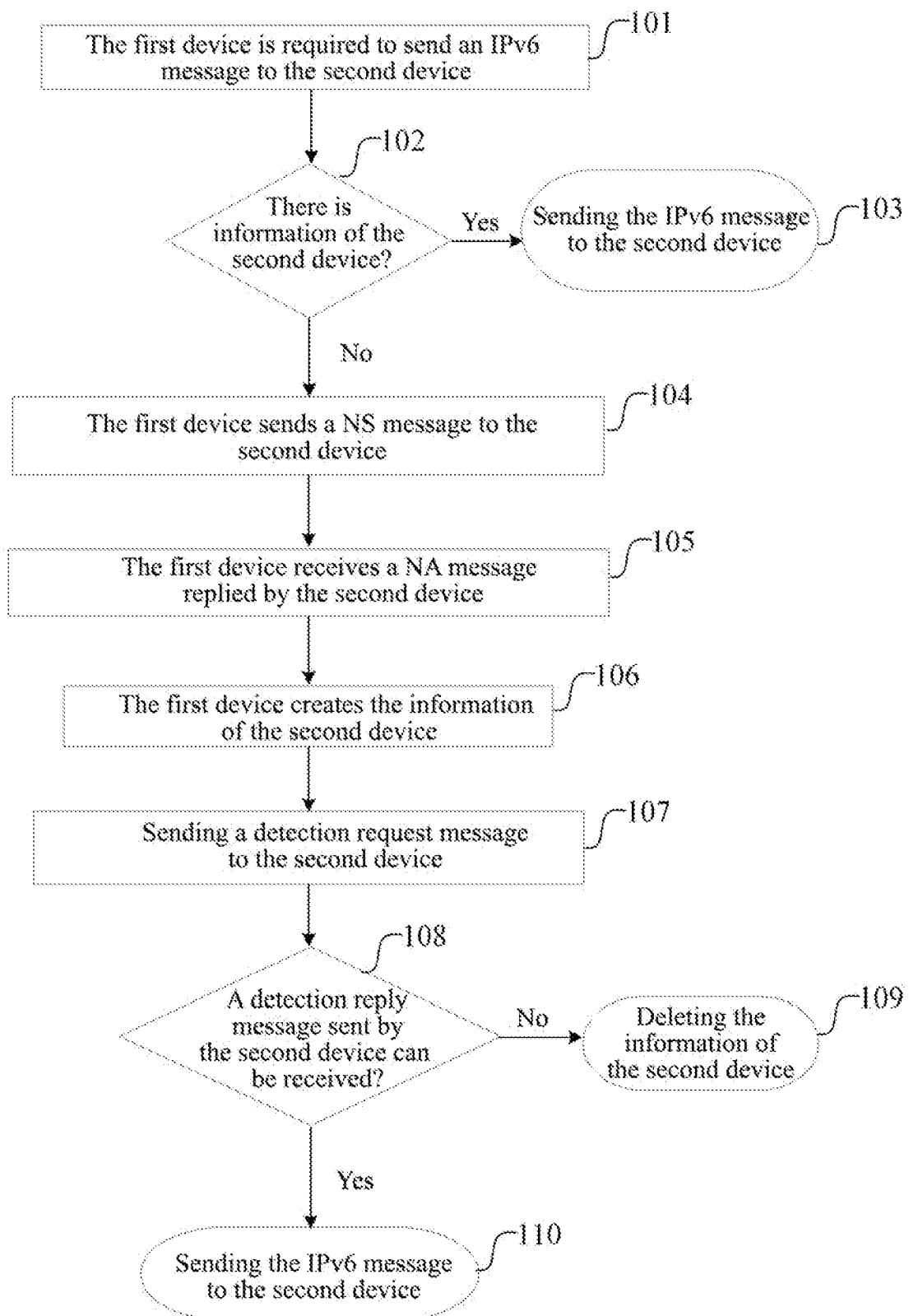
FIG. 1 is a flow chart of a method for the first device to create legal information of the second device in accordance with an embodiment of the present invention.

The first case is a method for decreasing effects of the NA message with the false link layer address when the first device creates information of the second device. As shown in FIG. 1, in this embodiment, the method for decreasing effects of the NA message with the false link layer address when the first device creates the information of the second device comprises the following steps.

Step 1, when the first device is required to send an IPv6 message to the second device (101), the first device determines whether it has a link layer address of the second device (102), and if yes, sends the IPv6 message to the second device based on the link layer address of the second device (103), the process ends, if not, step 2 is performed (104).

Step 2, the first device sends a NS message to the second device (104), the second device replies a NA message to the first device (105), and the first device creates information of the second device based on the NA message (106).

Step 3, the first device sends a detection request message to the second device based on the created information of the second device (107), and determines whether a detection reply message sent by the second device is received in a period of time (108), and if the first device does not receive the detection reply message sent by the second device, then the first device deletes the created information of the second device (109); if the first device receives the detection reply message sent by the second device, then the first device determines the created information of the second device is legal, reserves the created information of the second device, and sends the IPv6 message to the second device (110).

The period of time is configurable, and can be set by device manufacturers according to practical use environments. For example, when time delay of a network is larger, the period of time can be set to be longer.

Figure 2:
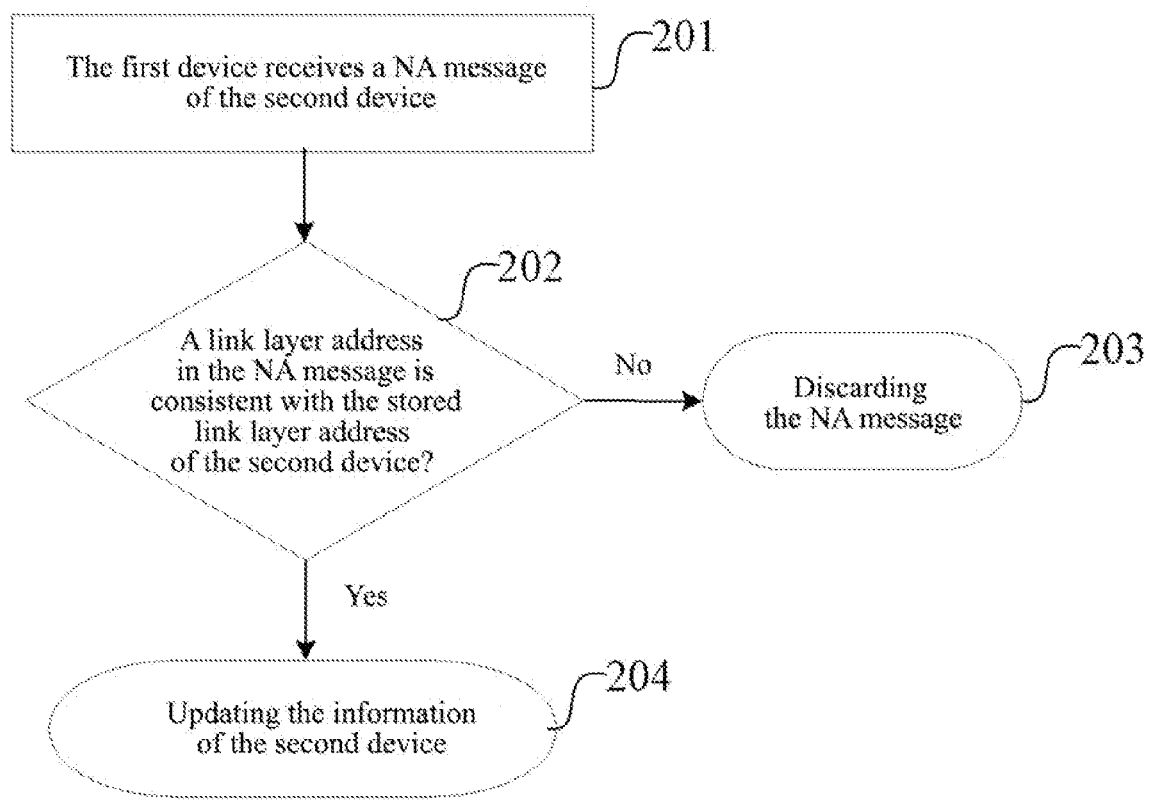
FIG. 2 is a flow chart of a method for the first device to receive and process a NA message sent by the second device in accordance with an embodiment of the present invention.

The second case is a method for decreasing effects of a NA message with a false link layer address when the first device having information of the second device receives the NA message sent by the second device. As shown in FIG. 2, the method comprises following steps.

The first device having the information of the second device receives the NA message sent by the second device (201), and determines whether a link layer address in the NA message is consistent with the stored link layer address of the second device (202), and if they are inconsistent, the NA message is discarded(203), the process ends; if they are consistent, the information of the second device stored in the first device is updated and kept active, the process ends.

The following examples are the specific applications of the above two methods.

EXAMPLE 1

Step 1, the first device sends a NS message to the second device, the second device replies the first NA message, and the first device creates information of the second device based on the first NA message.

Step 2, the first device sends an Internet Control Message Protocol Version 6 (ICMPv6) echo request message to the second device based on the created information of the second device, and if the first device does not receive a ICMPv6 echo reply message sent by the second device, then the first device deletes the created information of the second device, the process ends; if the first device receives the ICMPv6 echo reply message sent by the second device, then the first device determines that the created information of the second device is legal, and reserves the created information of the second device, and step 3 is performed.

Step 3, if the created information of the second device is legal, the second NA message sent by the second device is received, and the information of the second device stored in the first device is updated and kept alive.

EXAMPLE 2

Step 1, the first device sends a NS message to the second device, the second device replies the first NA message, and the first device creates information of the second device based on the first NA message.

Step 2, if the created information of the second device is legal, the second NA message sent by the second device is received, and whether a link layer address in the NA message is consistent with a link layer address of the second device stored in the first device is determined, and if they are inconsistent, the NA message is discarded without any processing; if they are consistent, the information of the second device stored in the first device is updated and kept active.

Comparing with example 1, in this example, the step of determining whether the created information of the second device is legal is omitted, but the step of determining whether the link layer addresses are consistent when the second NA message sent by the second device is received is added, also decreasing effects of the NA message with the false link layer address.

The present invention further provides a network device based on example 2 comprising:

a neighbor solicitation message sending module configured to send a neighbor solicitation message to a second device;

a neighbor advertisement message receiving module configured to receive a neighbor advertisement message replied by the second device to send to an information creating module; and the information creating module configured to determine whether information of the second device corresponding to the neighbor advertisement message exists; if it does not exist, create and store the information of the second device based on the received neighbor advertisement message; if it exists, determine whether a link layer address in the neighbor advertisement message is consistent with a link layer address in the created information of the second device; if yes, update the created information of the second device based on the neighbor advertisement message; if not, discard the neighbor advertisement message.

EXAMPLE 3

Step 1, the first device sends a NS message to the second device, the second device replies the first NA message, and the first device creates information of the second device based on the first NA message.

Step 2, the first device sends an ICMPv6 echo request message to the second device based on the created information of the second device, and if the first device does not receive an ICMPv6 echo reply message sent by the second device, then the first device deletes the created information of the second device, the process ends; if the first device receives the ICMPv6 echo reply message sent by the second device, then the first device determines that the created information of the second device is legal, and reserves the created information of the second device, and step 3 is performed.

Step 3, if the created information of the second device is legal, the second NA message sent by the second device is received, and whether a link layer address in the NA message is consistent with a link layer address of the second device stored in the first device is determined, and if they are inconsistent, the NA message is discarded without any processing, the process ends; if they are consistent, the information of the second device stored in the first device is update and kept active.

Comparing with example 1 and example 2, in this example, the step of determining whether the created information of the second device is legal is taken when the information of the second device is created. In addition, the step of determining whether the link layer addresses are consistent is taken when the second NA message sent by the second device is received. The combination of these two methods can decrease more effectively effects of the NA message with the false link layer address.

The present invention implements a method for processing messages in the ND protocol such that the IPv6 network can be securer using the method in accordance with the present invention.

Accordingly, the present invention further provides a network device based on example 1 and example 3 comprising:

a neighbor solicitation message sending module configured to send a neighbor solicitation message to a second device;

a neighbor advertisement message receiving module configured to receive a neighbor advertisement message replied by the second device to send to an information creating module;

the information creating module configured to create and store information of the second device based on the neighbor advertisement message, and send the information of the second device to a detection request message sending module; and delete the information of the second device after receiving a deletion indication of a detection reply message receiving module;

the detection request message sending module configured to send a detection request message to the second device based on the created information of the second device, and indicate the detection reply message receiving module; and the detection reply message receiving module configured to determine whether a detection reply message sent by the second device is received in a period of time after receiving an indication of the detection request message sending module, and if the detection reply message is not received, send the deletion indication to the information creating module.

The detection reply message receiving module is further configured to determine that the created information of the second device is legal if the detection reply message sent by the second device is received in the period of time, and notify the information creating module that the information of the second device is legal.

The information creating module is further configured to, after receiving a notification that the information of the second device is legal sent by the detection reply message receiving module, update the created legal information of the second device based on the neighbor advertisement message if the neighbor advertisement message sent by the second device is received.

The information of the second device contains a link layer address of the second device.

The information creating module is further configured to, after receiving the notification that the information of the second device is legal sent by the detection reply message receiving module, determine whether a link layer address in the neighbor advertisement message is consistent with the link layer address in the created information of the second device if the neighbor advertisement message sent by the second device is received, and if yes, update the information of the second device based on the neighbor advertisement message; if not, discard the neighbor advertisement message.
Industrial Applicability The present invention can effectively decrease effects of a NA messages with a false link layer address on a link layer address stored by the first device in following two cases. In the first case, when the information of the second device is created in the first device, the first device creates the information of the second device based on the received NA message sent by the second device, and determines whether the created information of the second device is legal by invoking the network control message protocol. In the second case, the first device receives a NA message sent by the second device after having created legal information of the second device, and verifies whether a link layer address in the NA message is consistent with the legal link layer address. The effects of the NA message with the false link layer address are effectively decreased by the processing of the NA messages in both cases.

What is claimed is:

1. A method for processing messages comprising:
   a first device sending a neighbor solicitation message to a second device, and creating information of the second device based on a neighbor advertisement message replied by the second device; and the method further comprising:
   the first device, after creating the information of the second device, sending a detection request message to the second device based on the created information of the second device; and
   the first device determining whether a detection reply message sent by the second device is received in a period of time; when the detection reply message is not received, the first device deleting the created information of the second device which is determined to be not legal; and when the first device receives the detection reply message sent by the second device in the period of time, the first device determining that the created information of the second device is legal, and reserving the created legal information of the second device;
   wherein, the information of the second device contains a link layer address of the second device;
   wherein after the step of the first device reserving the created legal information of the second device, the method further comprises:
   the first device receiving the neighbor advertisement message sent by the second device; and
   the first device determining whether a link layer address in the neighbor advertisement message is consistent with the link layer address in the created information of the second device;
   if yes, updating the created information of the second device based on the neighbor advertisement message; and
   if not, discarding the neighbor advertisement message.

2. The method according to claim 1, wherein after the step of the first device reserving the created legal information of the second device, the method further comprises:
   the first device receiving the neighbor advertisement message sent by the second device; and
   the first device updating the created legal information of the second device based on the neighbor advertisement message.

3. The method according to claim 1, wherein the step of the first device sending the detection request message to the second device comprises:
   the first device invoking a network control message protocol, and sending the detection request message in the network control message protocol to the second device.

4. A network device,. comprising: a processor, and a storage device for storing computer executable instructions that when executed by the processor cause the processor to perform the steps in following modules:
   a neighbor solicitation message sending module configured to send a neighbor solicitation message to a second device;
   a neighbor advertisement message receiving module configured to receive a neighbor advertisement message replied by the second device to send to an information creating module;
   the information creating module configured to create and store information of the second device based on the neighbor advertisement message, and send the information of the second device to a detection request message sending module; and delete the information of the second device after receiving a deletion indication of a detection reply message receiving module;
   the detection request message sending module configured to, after creating the information of the second device by the information creating module, send a detection request message to the second device based on the created information of the second device, and indicate the detection reply message receiving module; and
   the detection reply message receiving module configured to determine whether a detection reply message sent by the second device is received in a period of time after receiving an indication of the detection request message sending module, and when the detection reply message is not received, send the deletion indication to the information creating module; and when the detection reply message sent by the second device is received in the period of time, determine that the created information of the second device is legal and notify the information creating module that the information of the second device is legal;
   wherein, the information of the second device contains a link layer address of the second device;
   the information creating module is further configured to, after receiving the notification that the information of the second device is legal sent by the detection reply message receiving module, determine whether a link layer address in the neighbor advertisement message is consistent with the link layer address in the created information of the second device if the neighbor advertisement message sent by the second device is received, and if yes, update the information of the second device based on the neighbor advertisement message; if not, discard the neighbor advertisement message.

5. The network device according to claim 4, wherein:
   the information creating module is further configured to, after receiving a notification that the information of the second device is legal sent by the detection reply message receiving module, update the created legal information of the second device based on the neighbor advertisement message if the neighbor advertisement message sent by the second device is received.

* * * * *